(12) United States Patent
Umeda et al.

(10) Patent No.: US 11,557,564 B2
(45) Date of Patent: Jan. 17, 2023

(54) SEMICONDUCTOR DEVICE

(71) Applicant: SHINDENGEN ELECTRIC MANUFACTURING CO., LTD., Tokyo (JP)

(72) Inventors: Soichiro Umeda, Saitama (JP); Atsushi Kyutoku, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 15/733,890

(22) PCT Filed: Apr. 8, 2019

(86) PCT No.: PCT/JP2019/015295
§ 371 (c)(1),
(2) Date: Dec. 1, 2020

(87) PCT Pub. No.: WO2020/208677
PCT Pub. Date: Oct. 15, 2020

(65) Prior Publication Data
US 2021/0217721 A1    Jul. 15, 2021

(51) Int. Cl.
*H01L 23/00* (2006.01)
(52) U.S. Cl.
CPC .............. *H01L 24/40* (2013.01); *H01L 24/32* (2013.01); *H01L 24/73* (2013.01);
(Continued)
(58) Field of Classification Search
None
See application file for complete search history.

(56) References Cited

U.S. PATENT DOCUMENTS

2008/0150102 A1* 6/2008 Yokomae .............. H01L 25/162
257/E23.032
2015/0262915 A1 9/2015 Suzuki
(Continued)

FOREIGN PATENT DOCUMENTS

EP 3024024 A1 5/2016
JP 2008294390 A 12/2008
(Continued)

OTHER PUBLICATIONS

International Search Report in PCT/JP2019/015295, dated Jun. 4, 2019, 4pp.
(Continued)

*Primary Examiner* — Michelle Mandala
*Assistant Examiner* — Jordan M Klein
(74) *Attorney, Agent, or Firm* — Hauptman Ham, LLP

(57) ABSTRACT

A semiconductor device including a substrate; a chip on which a surface electrode is formed; and a lead. The lead includes a first electrode connecting portion disposed on the surface electrode and electrically connected to the surface electrode of the chip via a conductive bonding material; a second electrode connecting portion electrically connected to an electrode portion of a wiring pattern. A lead connected to the first electrode connecting portion and the second electrode connecting portion. The lead further has a thermal shrinking stress equalizing structure on a portion of an outer periphery of the first electrode connecting portion. The lead is configured to make a thermal shrinking stress applied to a conductive bonding material between the first electrode connecting portion and the surface electrode equal.

20 Claims, 7 Drawing Sheets

(52) U.S. Cl.
CPC .............. *H01L 2224/32245* (2013.01); *H01L 2224/4005* (2013.01); *H01L 2224/40106* (2013.01); *H01L 2224/40227* (2013.01); *H01L 2224/73213* (2013.01); *H01L 2924/3511* (2013.01)

(56) References Cited

U.S. PATENT DOCUMENTS

| | | | | |
|---|---|---|---|---|
| 2015/0357303 | A1* | 12/2015 | Kohl | H01L 23/49548 438/123 |
| 2016/0181221 | A1* | 6/2016 | Sunaga | H01L 25/18 257/401 |

FOREIGN PATENT DOCUMENTS

| | | |
|---|---|---|
| JP | 201365836 A | 4/2013 |
| JP | 2015176916 A | 10/2015 |
| JP | 201779228 A | 4/2017 |
| WO | 2016067414 A1 | 5/2016 |

OTHER PUBLICATIONS

Search Report in NL Application No. 2025197, dated Nov. 25, 2020, 12pp.

\* cited by examiner ions of the solder 950. For example, as shown in FIG. 7B, on a current conductive portion 936 side of the first electrode connecting portion 932, the solder 950 spreads by wetting along a surface of the lead 930 on a chip 920 side. On the other hand, on a side of the lead 930 opposite to a current conductive portion 936 side, not only the solder 950 spreads by wetting on a surface of the lead 930 on a chip 920 side, but also the solder 950 creeps along a side surface of the lead 930 (a side surface of the first electrode connecting portion 932). Accordingly, a surface area of the solder 950 which is brought into contact with the lead 930 (including a front surface and side surfaces of the lead 930) differs between one side (a current conductive portion 936 side) of the first electrode connecting portion 932 and a side of the first electrode connecting portion 932 opposite to the above-mentioned one side and hence, a thermal shrinking stress applied to the solder 950 between the chip 920 and the lead 930 differs depending on portions of the solder 950. In such a case, there is a concern that the chip 920 is inclined when the solder 950 is solidified due to the aggregation of the solder and hence, there is a concern that the solder 950 has a small thickness portion locally thus giving rise to a drawback that the acquisition of a highly reliable semiconductor device is difficult. Such a problem occurs not only in the case where a solder is used but also in other cases where a conductive bonding material other than a solder is used.

In view of the above-mentioned circumstances, the present invention has been made to overcome the above-mentioned drawbacks, and it is an object of the present invention to provide a highly reliable semiconductor device.

Solution to Problem

[1] According to the present invention, there is provided a semiconductor device including: a substrate which has a front surface on which a wiring pattern having an electrode portion is formed; a chip which is disposed on the substrate and having a surface electrode formed on a surface of the chip on a side opposite to a substrate side; and a lead which has: a first electrode connecting portion disposed on the surface electrode and electrically connected to the surface electrode of the chip via a conductive bonding material, a second electrode connecting portion electrically connected to the electrode portion of the wiring pattern, and a current conductive portion which is connected to the first electrode connecting portion and the second electrode connecting portion and forms a current conductive path between the first electrode connecting portion and the second electrode connecting portion, wherein the lead further has a thermal shrinking stress equalizing structure which is disposed on a portion of an outer periphery of the first electrode connecting portion to which the current conductive portion is not connected as viewed in a plan view, and is configured to make a thermal shrinking stress applied to the conductive bonding material disposed between the first electrode connecting portion and the surface electrode equal.

[2] In the semiconductor device of the present invention, it is preferable that the thermal shrinking stress equalizing structure have a bulging portion which bulges from the first electrode connecting portion on a side of the first electrode connecting portion opposite to a side of the first electrode connecting portion to which the current conductive portion is connected as viewed in a plan view.

[3] In the semiconductor device of the present invention, it is preferable that the bulging portion bulge to a position

SEMICONDUCTOR DEVICE

RELATED APPLICATIONS

The present application is a National Phase of International Application Number PCT/JP2019/015295, filed Apr. 8, 2019.

TECHNICAL FIELD

The present invention relates to a semiconductor device.

BACKGROUND ART

Conventionally, there has been known a semiconductor device where a chip and a lead are bonded to each other via a conductive bonding material (solder) (see patent document 1, for example).

As shown in FIG. 7A, the conventional semiconductor device 900 includes: a substrate 910 which has a front surface on which a wiring pattern is formed; a chip 920 which is mounted on the substrate 910 and has a surface electrode 922 formed on a surface of the chip 920 on a side opposite to a substrate 910 side; and a lead 930. The lead 930 has: a first electrode connecting portion 932 which is disposed on the surface electrode 922 and is electrically connected to the surface electrode 922 of the chip 920 via a solder 950 which is used as a conductive bonding material (see FIG. 7B); a second electrode connecting portion 934 which is connected to an electrode portion of the wiring pattern; and a current conductive portion 936 which is connected to the first electrode connecting portion 932 and the second electrode connecting portion 934 and forms a current conductive path between the first electrode connecting portion 932 and the second electrode connecting portion 934.

The conventional semiconductor device 900 includes the lead 930 having: the first electrode connecting portion 932 which is disposed on the surface electrode 922 and is electrically connected to the surface electrode 922 of the chip 920 via the solder 950; the second electrode connecting portion 934 which is connected to the electrode portion of the wiring pattern; and the current conductive portion 936 which is connected to the first electrode connecting portion 932 and the second electrode connecting portion 934 and forms the current conductive path between the first electrode connecting portion 932 and the second electrode connecting portion 934. Accordingly, such a conventional semiconductor device 900 is a semiconductor device which allows a conduction of a large current compared to a case where a conductive wire or the like is used for forming a current conductive path.

PRIOR ART DOCUMENT

Patent document
Patent document 1: JP 2015-176916 A

SUMMARY OF INVENTION

Problem to be Solved by the Invention

However, in the conventional semiconductor device 900, in bonding the chip 920 and the lead 930 to each other by the solder 950 by heating the substrate 910, the chip 920 and the lead 930, there is a possibility that a thermal shrinking stress which is applied to the solder 950 differs depending on symmetrical with the side to which the current conductive portion is connected with respect to the first electrode connecting portion.

[4] In the semiconductor device of the present invention, it is preferable that the thermal shrinking stress equalizing structure have cutouts or holes which are formed in the lead at positions where the cutouts or the holes opposedly face each other with the first electrode connecting portion sandwiched therebetween.

[5] In the semiconductor device of the present invention, it is preferable that the cutouts or the holes be disposed at positions symmetrical with respect to the surface electrode of the chip.

[6] In the semiconductor device of the present invention, it is preferable that regions where the conductive bonding materials are bonded to the lead be symmetrical with respect to the center of the surface electrode as viewed in a cross section perpendicular to an outer periphery of the chip.

[7] In the semiconductor device of the present invention, it is preferable that a heat resistance of the lead on one side of the center of the surface electrode and a heat resistance of the lead on the other side opposite to the one side be equal as viewed in the cross section perpendicular to the outer periphery of the chip.

[8] In the semiconductor device of the present invention, it is preferable that the semiconductor device further include a pin terminal which is disposed on the lead in a penetrating manner, wherein one end portion of the pin terminal protrudes to an outside, and the other end portion of the pin terminal is connected to the wiring pattern.

Advantageous Effects of Invention

According to the semiconductor device of the present invention, the lead has the thermal shrinking stress equalizing structure which is disposed on the portion of the outer periphery of the first electrode connecting portion to which the current conductive portion is not connected as viewed in a plan view, and is configured to make a thermal shrinking stress applied to the conductive bonding material disposed between the first electrode connecting portion and the surface electrode equal. Accordingly, even when the substrate, the chip and the lead are heated at the time of bonding these members by the conductive bonding material, it is possible to make the surface area of the conductive bonding material which is brought into contact with the lead (including the front surface and the side surface of the lead) equal between one side of the first electrode connecting portion and the opposite side of the first electrode connecting portion as viewed in a plan view. Accordingly, the chip is minimally inclined at the time of solidifying the conductive bonding material (for example, due to the aggregation of the solder) and hence, the conductive bonding material can maintain a uniform thickness whereby it is possible to provide a highly reliable semiconductor device.

Further, according to the semiconductor device of the present invention, the lead has the thermal shrinking stress equalizing structure which is disposed on the portion of the outer periphery of the first electrode connecting portion to which the current conductive portion is not connected as viewed in a plan view and is configured to make a thermal shrinking stress applied to the conductive bonding material disposed between the first electrode connecting portion and the surface electrode equal. Accordingly, a heat resistance from a predetermined position of the lead to the chip can be made equal as viewed in a plan view between one side of the first electrode connecting portion and the other side of the first electrode connecting portion opposite to the one side. Accordingly, a heat transfer speed at the time of heating can be made equal and hence, the surface area of the conductive bonding material which is brought into contact with the lead can be made further equal.

BRIEF DESCRIPTION OF DRAWINGS

FIG. 1A is a plan view of the semiconductor device 1, and FIG. 1B is a cross-sectional view of the semiconductor device 1.

FIG. 2A is a plan view of the semiconductor device 2, and FIG. 2B is a cross-sectional view of the semiconductor device 2. In FIG. 2A and FIG. 2B, symbol 34a indicates a second electrode connecting portion.

FIG. 4A is a view showing a state of the semiconductor device 3 before the semiconductor device 3 is sealed by a resin, and FIG. 4B is a view showing an equivalent circuit diagram of the semiconductor device 3. In FIG. 4A, symbols 30d, 30e, and 30f indicate leads.

FIG. 5A is an enlarged plan view of a main part showing a region A surrounded by a chain line in FIG. 4A and FIG. 4B, FIG. 5B is a cross-sectional view taken along a line C-C in FIG. 5A, and FIG. 5C is a cross-sectional view taken along a line D-D in FIG. 5A.

FIG. 6A is an enlarged plan view of a main part showing a region B surrounded by a chain line in FIG. 4A, and FIG. 6B is a cross-sectional view taken along a line E-E in FIG. 6A.

FIG. 7A is a plan view of the semiconductor device 900, and FIG. 7B is a view showing a drawback that the semiconductor device 900 has. In FIG. 7A and FIG. 7B, symbol 924 indicates a gate electrode, and symbol 951 indicates a solder.

DESCRIPTION OF EMBODIMENTS

Hereinafter, a semiconductor device according to the present invention is described based on an embodiment shown in drawings. The respective drawings are schematic views, and do not always strictly reflect the actual sizes.

Embodiment 1

1. Configuration of Semiconductor Device 1 According to Embodiment 1

Figure 1A:
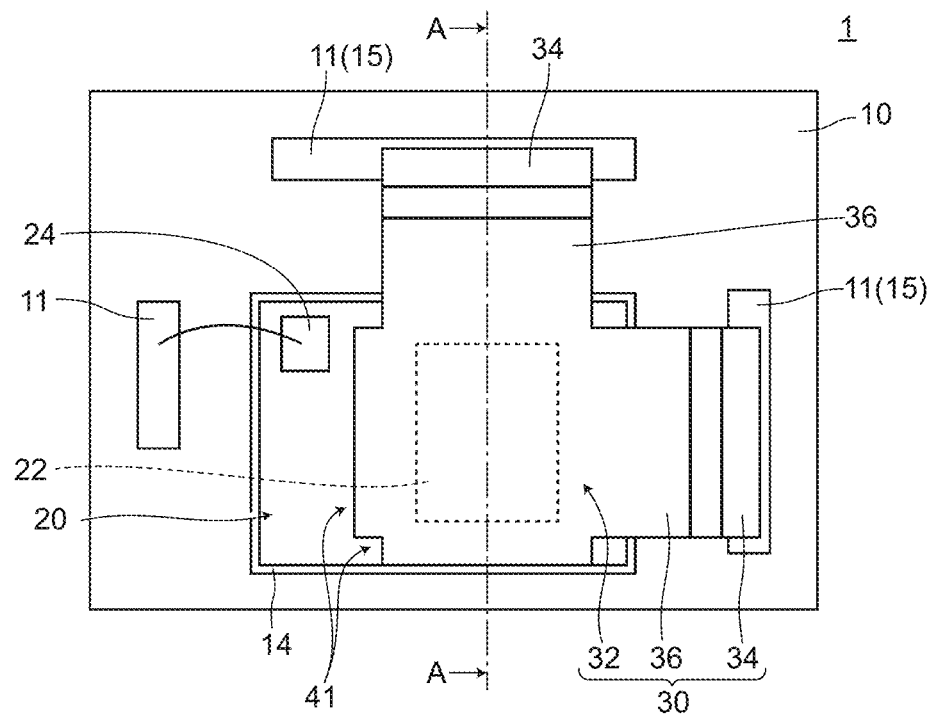
FIG. 1A and FIG. 1B are views showing a semiconductor device 1 according to an embodiment 1.
Figure 1B:
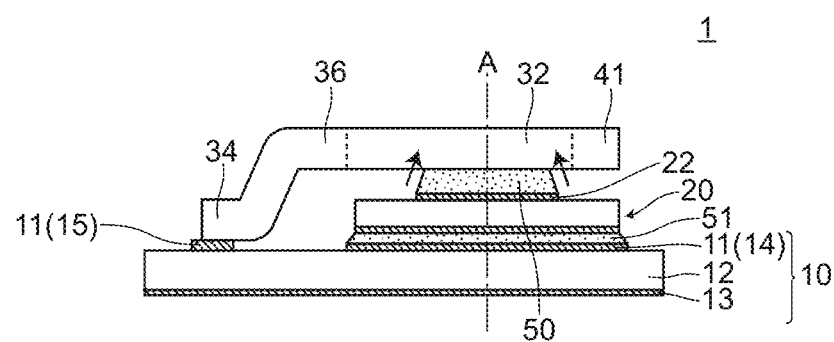

As shown in FIG. 1A and FIG. 1B, a semiconductor device 1 according to the embodiment 1 includes a substrate 10, a chip 20, and a lead 30.

The substrate 10 is a substrate where a wiring pattern 11 is formed on one front surface of an insulating substrate 12. In the embodiment 1, as the substrate 10, a DCB substrate (direct copper bonding substrate) where a metal plate 13 for heat radiation is formed on a back surface of the substrate is used. However, any suitable substrate such as a printed circuit board may be also used.

The wiring pattern 11 has: a chip mounting portion 14 on which the chip 20 is mounted; and an electrode portion 15 which is connected to a source electrode 22 (surface electrode) of the chip 20 via the lead 30. The wiring pattern 11 is connected to a terminal for external connection not shown in the drawing.

The chip 20 is mounted on the chip mounting portion 14 of the substrate 10 via a conductive bonding material (solder 51). The chip 20 is a power MOSFET (metal-oxide-semiconductor field-effect transistor) having: a drain electrode formed on one surface (a surface on a substrate side); a source electrode 22 formed on the other surface (a surface on a side opposite to the substrate) and functioning as a surface electrode; and a gate electrode 24. The drain electrode is bonded to a chip mounting surface 16 via a conductive bonding material (solder 51), and the gate electrode 24 is connected to a predetermined portion of the wiring pattern 11 via a wire.

The lead 30 is a planar metal member which includes: a first electrode connecting portion 32 which is disposed on the source electrode 22 and is electrically connected to the source electrode 22 via a conductive bonding material (solder 50); a second electrode connecting portion 34 which is electrically connected to the electrode portion 15 of the wiring pattern 11; a current conductive portion 36 which is connected to the first electrode connecting portion 32 and the second electrode connecting portion 34, and forms a current conductive path between the first electrode connecting portion 32 and the second electrode connecting portion 34; and a thermal shrinking stress equalizing structure.

The first electrode connecting portion 32 is formed in an approximately rectangular shape, and the current conductive portions 36 are formed on two adjacently disposed sides (an upper side and a right side in FIG. 1A) of the rectangular shape. The second electrode connecting portion 34 is bonded to the electrode portion 15 via a conductive bonding material (not shown in the drawing). The thermal shrinking stress equalizing structure is described later.

The conductive bonding material is an alloy or a metal having conductivity and bonding property. In this embodiment, the solders 50, 51 are used as the conductive bonding material. Solders 50, 51 may be lead-free solder. Solders 50, 51 may be a conductive bonding material other than solder such as a conductive adhesive agent having a silver paste or silver nano particles.

As viewed in a cross section perpendicular to a side of the chip 20, regions with which the solder 50 and the lead 30 are brought into contact (the regions where solder is in a wet state) are disposed symmetrical with respect to the center of the source electrode 22 (a portion indicated by a chain line A-A shown in FIG. 1B).

The thermal shrinking stress equalizing structure is disposed on a portion of an outer periphery of the first electrode connecting portion 32 to which the current conductive portion 36 is not connected as viewed in a plan view and makes a thermal shrinking stress (see an arrow shown in FIG. 1B) applied to the solder 50 disposed between the first electrode connecting portion 32 and the source electrode 22 equal. The thermal shrinking stress equalizing structure has a bulging portion 41 which bulges from the first electrode connecting portion 32 on a side opposite to a side where the first electrode connecting portion 32 is connected to the current conductive portion 36. As viewed in a plan view, the bulging portion 41 bulges to a position where the bulging portion 41 is symmetrical with the current conductive portion 36 with respect to the first electrode connecting portion 32.

As shown in FIG. 1B, on a current conductive portion 36 side of the first electrode connecting portion 32, the solder 50 spreads by wetting along a surface of the lead 30 on a chip 20 side. On the other hand, a bulging portion 41 is also disposed on a side opposite to a current conductive portion 36 side and hence, the solder 50 spreads by wetting along a surface of the lead 30 on a chip 20 side. Accordingly, even when heat is applied in bonding the substrate 10, the chip 20 and the lead 30 by the solders 50, 51, as viewed in a plan view, it is possible to make a surface area of the solder 50 which is brought into contact with the lead 30 equal between one side of the first electrode connecting portion 32 (current conductive portion 36 side) and a side opposite to the one side of the first electrode connecting portion 32 (bulging portion 41 side).

The thermal shrinking stress equalizing structure is configured such that the difference between a transfer speed of heat transferred to the solder 50 from a side of the first electrode connecting portion 32 which is connected to the current conductive portion 36 and a transfer speed of heat transferred to the solder 50 from a bulging portion 41 side of the first electrode connecting portion 32 is reduced.

In other words, as viewed in a cross section perpendicular to an outer periphery of the chip 20, the thermal shrinking stress equalizing structure is configured such that a heat resistance of the lead 30 on one side from the center of the source electrode 22 and a heat resistance of the lead on the other side from the center of the source electrode 22 become equal.

Accordingly, the thermal shrinking stress equalizing structure is configured to make the solder 50 uniformly spread by wetting by making heat transferred to the solder 50 between the source electrode 22 and the lead 30 equal.

2. Advantageous Effects of Semiconductor Device 1 According to Embodiment 1

According to the semiconductor device 1 of the embodiment 1, the lead 30 has the thermal shrinking stress equalizing structure which is disposed on the portion of the outer periphery of the first electrode connecting portion 32 to which the current conductive portion 36 is not connected as viewed in a plan view and makes a thermal shrinking stress applied to the solder 50 disposed between the first electrode connecting portion 32 and the source electrode 22 as viewed in a plan view equal. Accordingly, even when the substrate 10, the chip 20 and the lead 30 are heated at the time of bonding these members by the solder 50, the surface area of the solder 50 which is brought into contact with the lead 30 (including the front surface and the side surface of the lead) can be made equal between one side of the first electrode connecting portion 32 and the side opposite to the one side of the first electrode connecting portion 32 as viewed in a plan view. Accordingly, the chip 20 is minimally inclined at the time of solidifying a conductive bonding material (for example, due to the aggregation of the solder 50) and hence, the solder 50 can maintain a uniform thickness whereby it is possible to provide a highly reliable semiconductor device.

Further, according to the semiconductor device 1 of the embodiment 1, the lead 30 has the thermal shrinking stress equalizing structure which is disposed on the portion of the outer periphery of the first electrode connecting portion 32 to which the current conductive portion 36 is not connected, as viewed in a plan view, and makes a thermal shrinking stress applied to the solder 50 disposed between the first electrode connecting portion 32 and the source electrode 22 equal. Accordingly, it is possible to make a heat resistance from a predetermined position of the lead to the chip 20 equal between one side of the first electrode connecting portion 32 and the other side of the first electrode connecting portion 32 opposite to the one side as viewed in a plan view. Accordingly, a heat transfer speed at the time of heating can be made equal between the one side and the other side of the first electrode connecting portion 32 and hence, a surface area of the solder 50 which is brought into contact with the lead 30 can be made further equal between the one side and the other side of the first electrode connecting portion 32.

According to the semiconductor device 1 of the embodiment 1, the thermal shrinking stress equalizing structure has the bulging portion 41 which bulges from the first electrode connecting portion 32 on a side of the first electrode connecting portion 32 opposite to a side of the first electrode connecting portion 32 which is connected to the current conductive portion 36 as viewed in a plan view. Accordingly, the solder 50 spreads by wetting along the surface of the lead 30 on a chip 20 side on both a current conductive portion 36 side of the first electrode connecting portion 32 and a bulging portion 41 side of the first electrode connecting portion 32 opposite to the current conductive portion 36 side. Accordingly, the surface area (including the front surface and the side surface of the lead) of the solder 50 which is brought into contact with the lead 30 can be made equal between one side and the side opposite to the one side of the first electrode connecting portion 32 as viewed in a plan view.

Further, according to the semiconductor device 1 of the embodiment 1, the bulging portion 41 bulges to a position symmetrical with a side where the current conductive portion 36 is connected to the first electrode connecting portion 32 with respect to the first electrode connecting portion 32. Accordingly, a difference between a transfer speed of heat transferred to the solder 50 from the side to which the current conductive portion 36 is connected and a transfer speed of heat transferred to the solder 50 from the bulging portion 41 side becomes smaller. Accordingly, a difference in a thermal shrinking stress applied to the solder 50 between the side of the first electrode connecting portion 32 to which the current conductive portion 36 is connected and the side of the first electrode connecting portion 32 opposite to such a side becomes smaller and hence, the chip 20 is minimally inclined when the solder 50 is solidified.

Further, according to the semiconductor device 1 of the embodiment 1, regions where the solder 50 is disposed with respect to the center of the source electrode 22 are symmetrical. Accordingly, the chip 20 is minimally inclined and hence, the solder 50 can maintain a uniform thickness whereby it is possible to provide a more reliable semiconductor device.

Further, according to the semiconductor device 1 of the embodiment 1, as viewed in a cross section perpendicular to the outer periphery of the chip 20, a heat resistance of the lead 30 on one side from the center of the source electrode 22 and a heat resistance of the lead 30 on the other side from the center of the source electrode 22 become equal. Accordingly, a thermal shrinking stress applied to the solder 50 becomes also symmetrical between on one side from the center of the source electrode 22 and on the other side from the center of the source electrode 22 and hence, the occurrence of the inclination of the chip 20 can be more effectively prevented.

Embodiment 2

A semiconductor device 2 according to the embodiment 2 basically has substantially the same configuration as the semiconductor device 1 according to the embodiment 1. However, the semiconductor device 2 according to the embodiment 2 differs from the semiconductor device 1 according to the embodiment 1 with respect to the configuration of a thermal shrinking stress equalizing structure. That is, in the semiconductor device 2 according to the embodiment 2, the thermal shrinking stress equalizing structure has cutouts 42 formed in a lead 30a at positions which opposedly face each other with a first electrode connecting portion 32a sandwiched therebetween (see FIG. 2A and FIG. 2B).

Figure 2A:
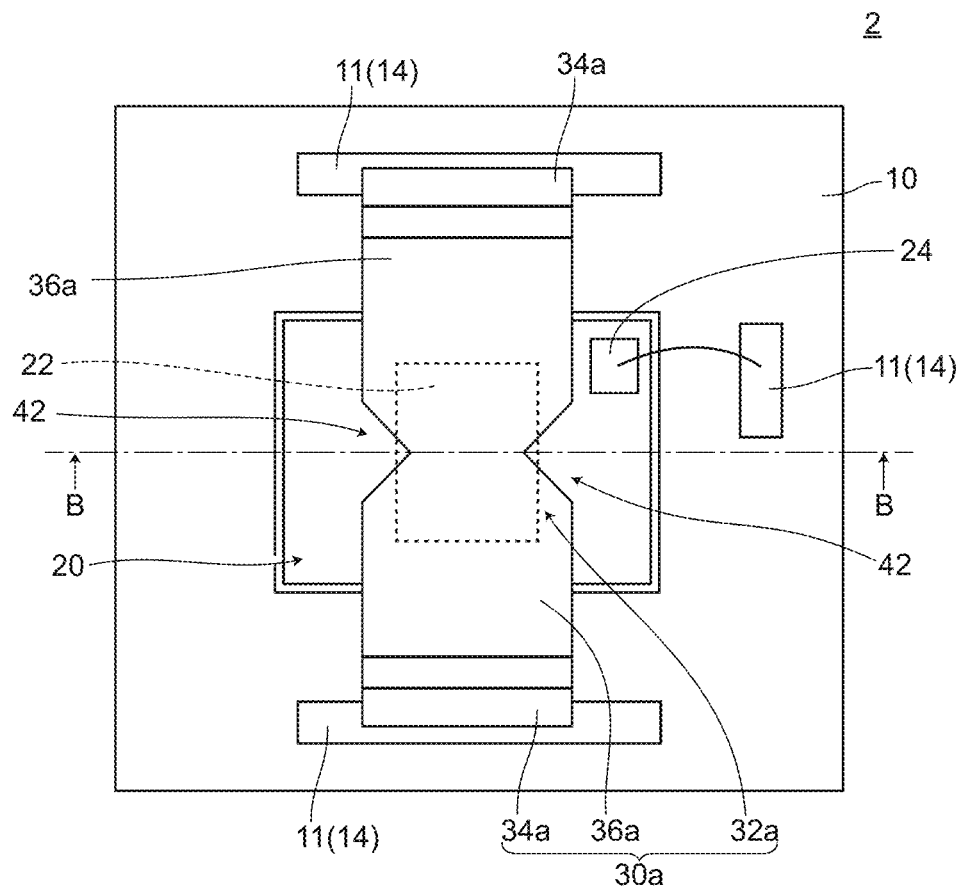
FIG. 2A and FIG. 2B are views showing a semiconductor device 2 according to an embodiment 2.

In the lead 30a of the embodiment 2, current conductive portions 36a are formed on two opposedly facing sides of a rectangular first electrode connecting portion 32a (see an upper side and a lower side of FIG. 2A). The cutouts 42 are formed on portions of the lead 30a where the current conductive portion 36a is not connected to the first electrode connecting portion 32a, that is, sides which are disposed adjacently to the respective current conductive portions 36a (a right side and a left side in FIG. 2A). The cutouts 42 are respectively formed in a triangular shape having a vertex toward a chip 20 side. The cutouts 42 are disposed at positions symmetrical with respect to a source electrode 22 of the chip 20.

Figure 2B:
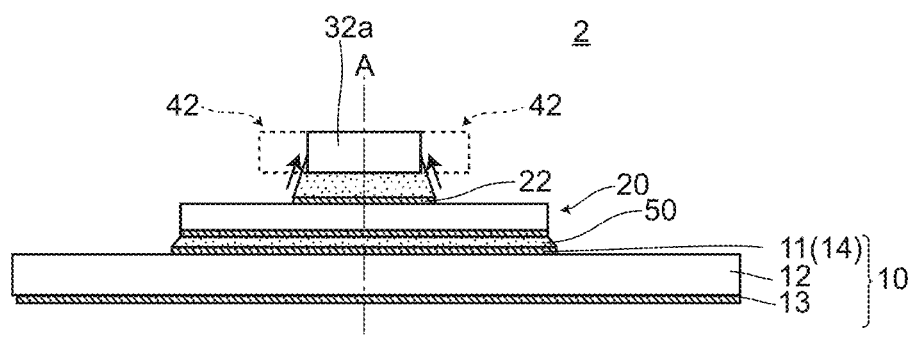

As shown in FIG. 2B, in both two opposedly facing sides of the first electrode connecting portion 32a where the cutouts 42 are formed, a solder 50 spreads by wetting along the front surface of the lead 30a on a chip 20 side, and the solder 50 creeps along side surfaces of the lead 30a (side surfaces of the cutouts 42). Accordingly, even when heat is applied in bonding a substrate 10, the chip 20 and the lead 30a to each other by the solder 50, a surface area of the solder 50 which is brought into contact with the lead 30a (including a front surface and side surfaces of the lead 30a) as viewed in a plan view can be made equal between one side and the other side of the first electrode connecting portion 32a (at two opposedly facing sides where the cutouts 42 are formed). As a result, a thermal shrinking stress applied to the solder 50 can be made equal.

In this manner, the semiconductor device 2 according to the embodiment 2 differs from the semiconductor device 1 according to the embodiment 1 with respect to the configuration of the thermal shrinking stress equalizing structure. However, in the same manner as the case of the semiconductor device 1 according to the embodiment 1, according to the semiconductor device 2 of the embodiment 2, the lead 30a has a thermal shrinking stress equalizing structure which is disposed on portions of an outer periphery of the first electrode connecting portion 32a to which the current conductive portions 36a are not connected and makes a thermal shrinking stress applied to the solder 50 disposed between the first electrode connecting portion 32a and the source electrode 22 equal. Accordingly, even when heat is applied in bonding a substrate 10, the chip 20 and the lead 30a to each other by the solder 50 and a solder 51, the surface area of the solder 50 which is brought into contact with the lead 30a (including the front surface and the side surfaces of the lead 30a) as viewed in a plan view can be made equal between one side and the other side of the first electrode connecting portion 32a. Accordingly, the chip 20 is minimally inclined at the time of solidifying a conductive bonding material (for example, due to the aggregation of the solder 50) and hence, the solder 50 can maintain a uniform thickness whereby it is possible to provide a highly reliable semiconductor device.

Further, according to the semiconductor device 2 of the embodiment 2, the thermal shrinking stress equalizing structure has the cutouts 42 formed in the lead 30a at the positions which opposedly face each other with the first electrode connecting portion 32 sandwiched therebetween. Accordingly, in both two opposedly facing sides of the first electrode connecting portion 32a where the cutouts 42 are formed, the solder 50 spreads by wetting along a front surface of the lead 30a on a chip 20 side, and the solder 50 creeps along side surfaces of the lead 30a (side surfaces of the cutouts 42). Accordingly, even when heat is applied in bonding the substrate 10, the chip 20 and the lead 30 to each other by the solder, a surface area of the solder 50 which is brought into contact with the lead 30a (including the front surface and the side surfaces of the lead 30a) as viewed in a plan view can be made equal between one side and the other side of the first electrode connecting portion 32a (two opposedly facing sides where the cutouts 42 are formed). As a result, a thermal shrinking stress applied to the solder 50 can be made equal between one side and the other side of the first electrode connecting portion 32a.

According to the semiconductor device 2 of the embodiment 2, the cutouts 42 are disposed at positions symmetrical with respect to a source electrode 22 of the chip 20 and hence, the surface area of the solder 50 which is brought into contact with the lead 30a (including the front surface and the side surfaces of the lead 30a) as viewed in a plan view can be made equal with more certainty between one side and the other side of the first electrode connecting portions 32a (two opposedly facing sides where the cutouts 42 are formed).

The semiconductor device 2 according to the embodiment has substantially the same configuration as the semiconductor device 1 according to the embodiment 1 except for the configurations of the thermal shrinking stress equalizing structure. Accordingly, the semiconductor device 2 according to the embodiment 2 acquires the corresponding advantageous effects found amongst all advantageous effects which the semiconductor device 1 according to the embodiment 1 acquires.

Embodiment 3

A semiconductor device 3 according to the embodiment 3 basically has substantially the same configuration as the semiconductor device 1 according to the embodiment 1. However, the semiconductor device 3 according to the embodiment 3 differs from the semiconductor device 1 according to the embodiment 1 with respect to points that the semiconductor device 3 according to the embodiment 3 has two chips as chips, and also has pin terminals.

Figure 3:
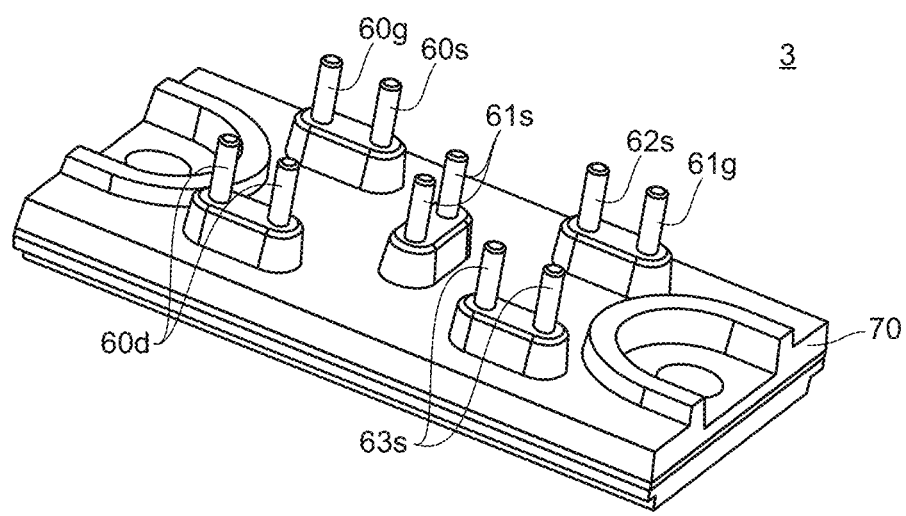
FIG. 3 is a perspective view for describing a semiconductor device 3 according to an embodiment 3.

The semiconductor device 3 according to the embodiment 3 is not a semiconductor device where terminals are provided at side surfaces of the semiconductor device sealed by a resin but, as shown in FIG. 3, is a semiconductor device provided with terminals (pin terminals) protruding from an upper surface of the semiconductor device which is sealed by a resin.

The pin terminals are disposed on a lead in a penetrating manner, wherein one end portion of the pin terminal protrudes to the outside from a mold resin 70, and the other end portion is connected to a wiring pattern. The pin terminal is an elongated circular columnar conductive pin having a flange portion which is a large diameter portion at a center portion (see FIG. 3 and FIG. 4A). The pin terminal is used as a terminal for external connection, and also is used as a member which connects the lead and the wiring pattern to each other.

Figure 4A:
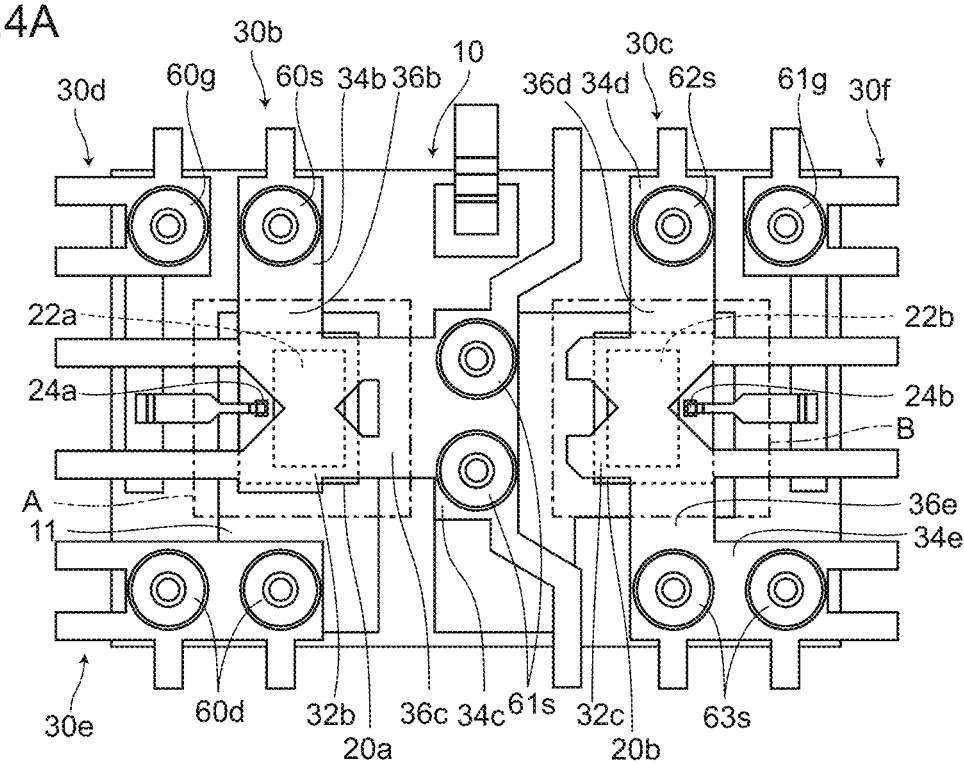
FIG. 4A and FIG. 4B are views for describing the semiconductor device 3 according to the embodiment 3.
Figure 4B:
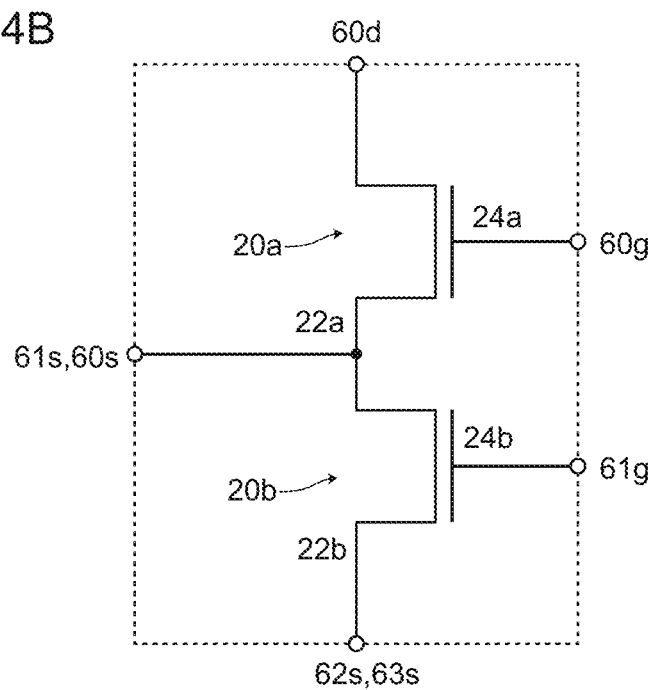

As shown in FIG. 3 and FIG. 4A and FIG. 4B, the pin terminal includes: a pin terminal 60g which is connected to a gate electrode 24a of a chip 20a; a pin terminal 60s which is connected to a source electrode 22a of the chip 20a; a pin terminal 61s which is connected to the source electrode 22a of the chip 20a and a drain electrode of a chip 20b; two pin terminals 60d which are connected to a drain electrode of the chip 20a; a pin terminal 61g which is connected to a gate electrode 24b of the chip 20b; and pin terminals 62s,63s which are connected to a source electrode 22b of the chip 20b.

As shown in FIG. 4A and FIG. 4B, the semiconductor device 3 according to the embodiment 3 has two chips 20a, 20b as the chips. Each of these two chips has a drain electrode (not shown in a drawing) on a wiring pattern 11 (chip mounting surface) side of a substrate 10, and has the source electrodes 22a, 22b and the gate electrodes 24a, 24b on a side opposite to the substrate 10. With such a configuration, a circuit where two switching elements are connected in series is formed by two chips 20a, 20b, the wiring pattern 11 of the substrate 10, the leads 30b, 30c and the respective pin terminals (see FIG. 4B).

As shown in FIG. 4A, the lead 30b includes: a first electrode connecting portion 32b disposed on the source electrode 22a of the chip 20a and electrically connected to the source electrode 22a of the chip 20a via a solder 50; a second electrode connecting portion 34b connected to an electrode portion of the wiring pattern 11 via the pin terminal 60s; a second electrode connecting portion 34c connected to the electrode portion of the wiring pattern 11 via the pin terminal 61s; a current conductive portion 36b connected to the first electrode connecting portion 32b and the second electrode connecting portion 34b and forming a current conductive path between the first electrode connecting portion 32b and the second electrode connecting portion 34b; and a current conductive portion 36c connected to the first electrode connecting portion 32b and the second electrode connecting portion 34c and forming a current conductive path between the first electrode connecting portion 32b and the second electrode connecting portion 34c.

Figure 5A:
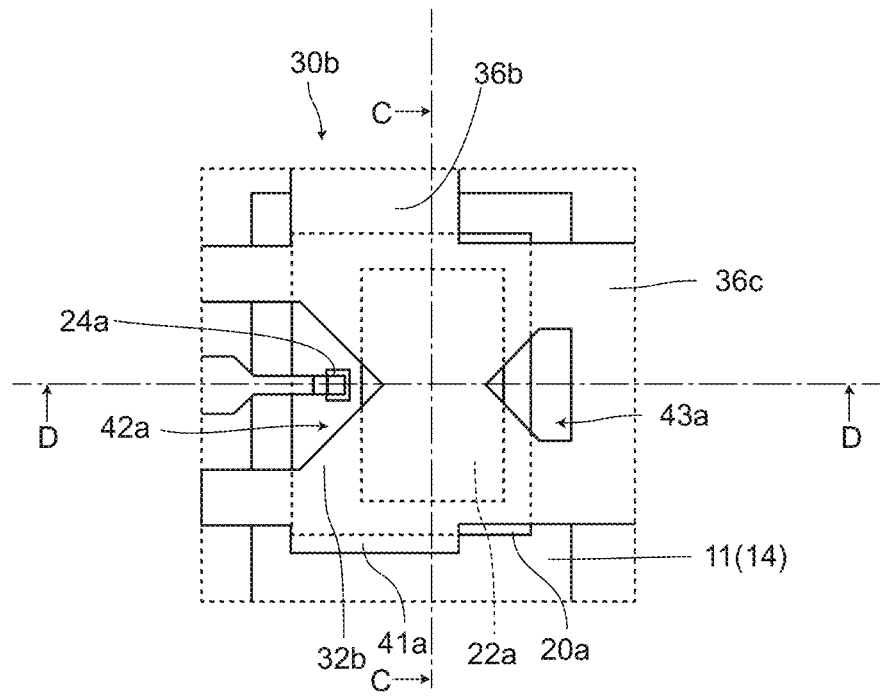
FIG. 5A, FIG. 5B and FIG. 5C are views for describing a thermal stress equalizing structure (bulging portion 41a) in the embodiment 3.

As shown in FIG. 4A and FIG. 4B and FIG. 5A, FIG. 5B and FIG. 5C, the lead 30b includes a bulging portion 41a which forms a thermal shrinking stress equalizing structure at a side (portion) of an outer periphery of the first electrode connecting portion 32b which is the side opposite to a current conductive portion 36b side (a portion on a lower side of FIG. 4A and FIG. 5A) which is not connected to the current conductive portions 36b, 36c (see FIG. 5A).

The current conductive portion 36b is connected to the first electrode connecting portion 32b at a position where the current conductive portion 36b is displaced from the source electrode 22. That is, the current conductive portion 36b is connected to the first electrode connecting portion 32b such that the source electrode 22a is displaced from a region extending to a source electrode side. The bulging portion 41a is disposed at a position where the bulging portion 41a is symmetrical with the current conductive portion 36b with respect to the first electrode connecting portion 32b.

Figure 5B:
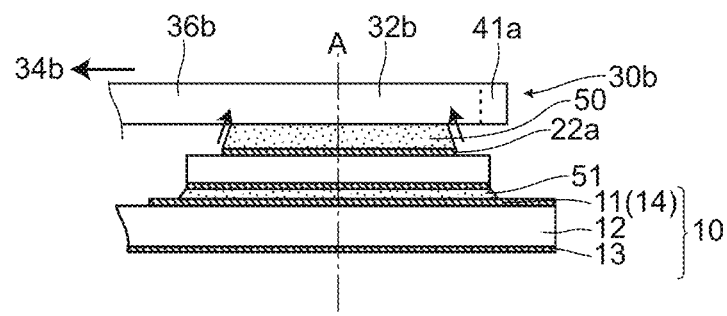

As shown in FIG. 5B, on a current conductive portion 36b side of the first electrode connecting portion 32b, the solder 50 spreads by wetting along a surface of the lead 30b on a chip 20a side. On the other hand, the bulging portion 41a is also disposed on a side opposite to a current conductive portion 36b side and hence, the solder 50 spreads by wetting along a surface of the lead 30b on a chip 20a side. Accordingly, even when heat is applied in bonding the substrate 10, the chip 20b and the lead 30b by the solder 50, it is possible to make a surface area of the solder 50 which is brought into contact with the lead 30b equal between one side (current conductive portion 36b side) and a side opposite to the one side (bulging portion 41a side) of the first electrode connecting portion 32b as viewed in a plan view.

In the lead 30b, a hole 43a is formed in the current conductive portion 36b, and a cutout 42a which corresponds to the hole 43a is formed in the current conductive portion 36b at positions which oppositely face each other with the source electrode 22 sandwiched therebetween. The formation of the hole in the current conductive portion 36b is not desirable since the hole obstructs the conduction of an electric current. However, as in the case of this embodiment, when a sufficient conduction of an electric current is ensured by increasing a cross-sectional area of the current conducive portion 36b by increasing a width of the current conductive portion 36b, it is possible to prevent the occurrence of a difference in a thermal shrinking stress applied to a conductive bonding material by forming the cutout or the hole.

Figure 5C:
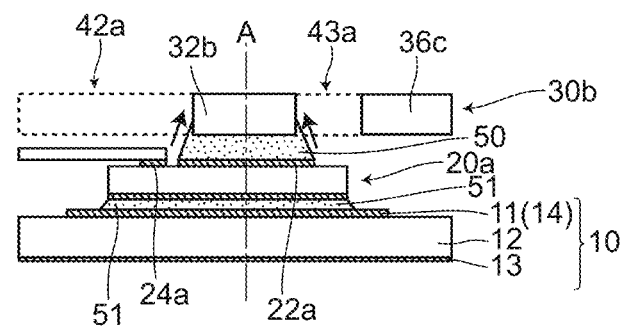

That is, as shown in FIG. 5C, in both two opposedly facing sides of the first electrode connecting portion 32b where the cutout 42a and the hole 43a are formed, a solder 50 spreads by wetting along surfaces of the lead 30b on a chip 20a side, and the solder 50 creeps along side surfaces of the lead 30b (a side surface of the cutout 42a and a side surface of the hole 43a). Accordingly, even when heat is applied in bonding a substrate 10, the chip 20a and the lead 30b to each other by the solder 50, a surface area of the solder 50 which is brought into contact with the lead 30b (including a front surface and side surfaces of the lead 30) as viewed in a plan view can be made equal between one side of the first electrode connecting portion 32b and the other side (the side where the cutout 42a is formed and the side where the hole 43a which faces the cutout 42a is formed) of the first electrode connecting portion 32b.

As shown in FIG. 4A and FIG. 4B and FIG. 6A and FIG. 6B, the lead 30c includes: a first electrode connecting portion 32c disposed on the source electrode 22b of the chip 20a and electrically connected to the source electrode 22b of the chip 20b via the solder 50; a second electrode connecting portion 34d connected to an electrode portion of the wiring pattern 11 via the pin terminal 62s (see FIG. 4A); a second electrode connecting portion 34e connected to the electrode portion of the wiring pattern 11 via the pin terminal 63s (see FIG. 4A); a current conductive portion 36d connected to the first electrode connecting portion 32c and the second electrode connecting portion 34d, and forming a current conductive path between the first electrode conductive portion 32c and the second electrode connecting portion 34d; and a current conductive portion 36e connected to the first electrode connecting portion 32c and the second electrode connecting portion 34e and forming a current conductive path between the first electrode connecting portion 32c and the second electrode connecting portion 34e.

The current conductive portions 36d, 36e are formed on both two opposedly facing sides (an upper side and a lower side in FIG. 4A and FIG. 4B and FIG. 6A and FIG. 6B) of a rectangular shape of the first electrode connecting portion 32. Cutouts 42b, 42c are formed on a portion to which the current conductive portions are not connected, that is, sides disposed adjacently to the respective current conductive portions 36d, 36e in a state where each cutout 42b, 42c is formed in a pentagonal shape having a vertex toward a chip side. The cutouts 42b, 42c are disposed at positions symmetrical with respect to the source electrode 22b of the chip 20b. However, a thickness and a length of the cutouts 42b, 42c are taken into account such that balancing of an area (volume) of a portion which is not cut out is ensured.

Figure 6A:
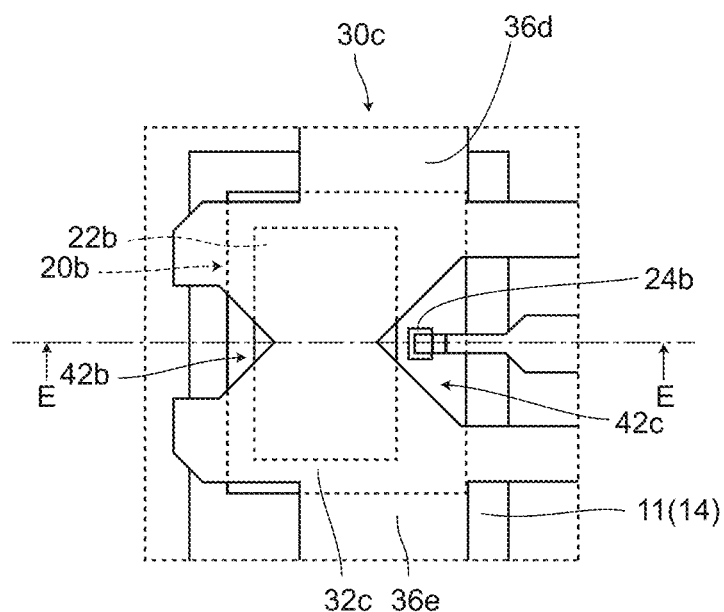
FIG. 6A and FIG. 6B are views for describing a second thermal stress equalizing structure (cutouts 42b, 42c) in the embodiment 3.
Figure 6B:
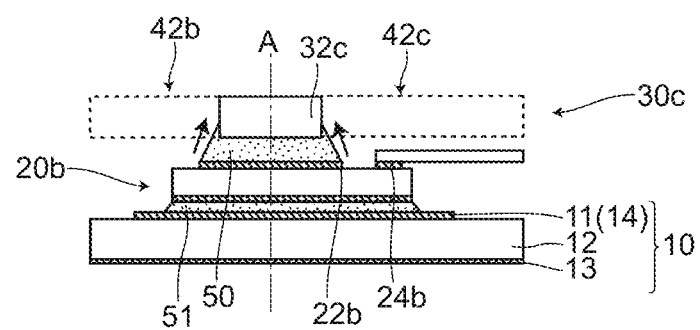
Figure 7A:
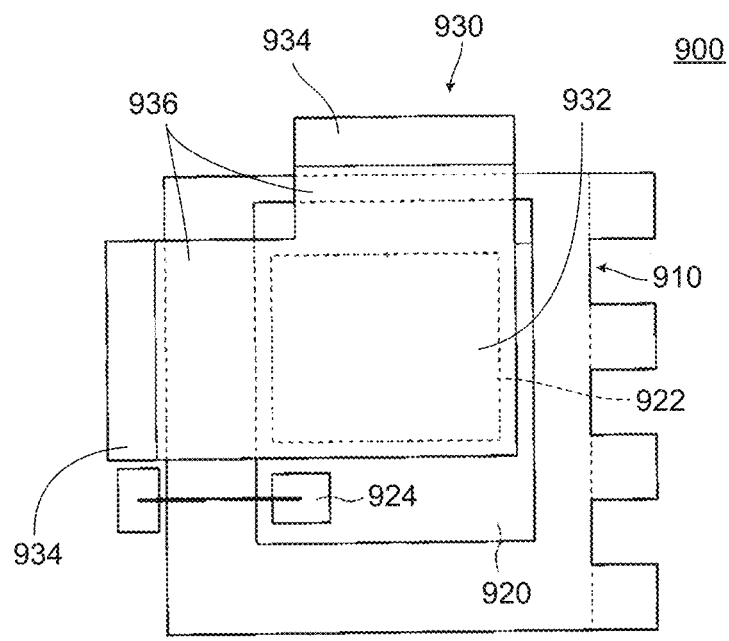
FIG. 7A and FIG. 7B are views for describing a conventional semiconductor device 900.
Figure 7B:
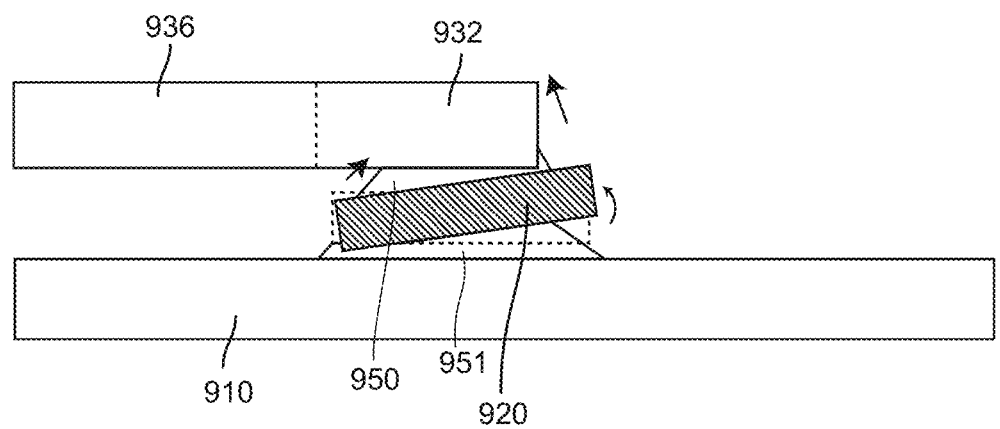

As shown in FIG. 6B, in both two opposedly facing sides of the first electrode connecting portion 32c where the cutouts 42b, 42c are formed, the solder 50 spreads by wetting along a front surface of the lead 30c on a chip 20b side, and the solder 50 creeps along side surfaces of the lead 30c (side surfaces of the cutouts 42b, 42c). Accordingly, even when heat is applied in bonding a substrate, the chip 20b and the lead 30c to each other by the solder 50, a surface area of the solder 50 which is brought into contact with the lead 30c (including a front surface and side surfaces of the lead 30c) as viewed in a plan view can be made equal between one side and the other side of the first electrode connecting portion 32c (two opposedly facing sides on which the cutouts 42b, 42c are formed). As a result, a thermal shrinking stress applied to the solder 50 can be made equal.

In this manner, the semiconductor device 3 according to the embodiment 3 differs from the semiconductor device according to the embodiment 1 with respect to a point that the semiconductor device 3 according to the embodiment 3 includes two chips as the chips and the pin terminals. However, in the same manner as the case of the semiconductor device 1 according to the embodiment 1 and the semiconductor device 2 according to the embodiment 2, the leads 30b, 30c have the thermal shrinking stress equalizing structure which is disposed on portions of outer peripheries of the first electrode connecting portions 32b, 32c to which the current conductive portion is not connected and make a thermal shrinking stress applied to the solder 50 disposed between the first electrode connecting portions 32b, 32c and the source electrodes 22b, 22c equal. Accordingly, surface areas of the solders 50 which are brought into contact with the leads 30b, 30c (including front surfaces and side surfaces of the leads 30b, 30c) as viewed in a plan view can be made equal between one side and the other side of the first electrode connecting portion 32b, 32c. Accordingly, the chips 20a, 20b are minimally inclined when a conductive bonding material is solidified (for example, due to the aggregation of the solder 50) and hence, the solder 50 can maintain a uniform thickness whereby it is possible to provide highly reliable semiconductor devices.

The semiconductor device 3 according to the embodiment 3 further includes the pin terminals which are disposed on the leads 30b, 30c in a penetrating manner, wherein one end portion of the pin terminal protrudes to the outside and the other end portion of the pin terminal is connected to the wiring pattern 11. With such a configuration, even in a case where it is difficult for the leads 30b, 30c to realize the self-alignment due to fixing of the leads 30b, 30c to the substrate 10 by way of the pin terminals 60s, 61s, 62s, 63s, a difference minimally occurs in a thermal shrinking stress applied to the solder 50 and hence, offsetting of the conductive bonding material minimally Occurs. Accordingly, the chips 20b, 20c are minimally inclined when the conductive bonding material is solidified (due to the aggregation of the solder) and hence, a thickness of the conductive bonding material can maintain a uniform thickness whereby it is possible to provide a highly reliable semiconductor device.

The semiconductor device 3 according to the embodiment has substantially the same configuration as the semiconductor device 1 according to the embodiment 1 with respect to the points other than the point that the semiconductor device 3 according to the embodiment 3 includes two chips as the chips and also includes the pin terminals. Accordingly, the semiconductor device 3 according to the embodiment 3 acquires the corresponding advantageous effects found amongst all advantageous effects which the semiconductor device 1 according to the embodiment 1 acquires.

Although the present invention has been described based on the above-mentioned embodiments, the present invention is not limited to the above-mentioned embodiments. The present invention can be carried out in various modes without departing from the gist of the present invention, and the following modifications are also conceivable, for example.

(1) In the above-mentioned embodiments, the materials, the shapes, the positions, the sizes and the like are described for an exemplifying purpose, and these can be changed within a scope that the advantageous effects of the present invention are not impaired.

(2) In the above-mentioned embodiments 2 and 3, the cutouts are formed as the thermal shrinking stress equalizing structure. However, the present invention is not limited to such a structure. Holes may be formed as the thermal shrinking stress equalizing structure.

(3) In the above-mentioned embodiments 2 and 3, a triangular or pentagonal cutout is formed as the cutout. However, the present invention is not limited to such a cutout. As such a cutout, a cutout having a rectangular shape, a circular shape or other suitable shape may be formed.

(4) In the above-mentioned respective embodiments, a chip which is a MOSFET is used as the chip. However, the present invention is not limited to such a chip. As the chip, an IGBT, a thyristor, a diode, or other suitable element may be also used. Further, as a material for forming the chip, silicon, SiC, GaN or a suitable material may be also used.

(5) In the above-mentioned respective embodiments, as the chip, the so-called vertical semiconductor device which has the source electrode on one surface of the chip and the drain electrode on the other surface of the chip and where a main current flows vertically is used. However, the present invention is not limited to such a vertical semiconductor device. As the chip, a so-called lateral semiconductor device which has a source electrode and a drain electrode on one surface of the chip and where a main current flows laterally may be used.

The invention claimed is:

1. A semiconductor device comprising:
  a chip including a surface electrode formed on a surface; and
  a lead comprising:
    a first electrode connecting portion disposed on the surface electrode and electrically connected to the surface electrode of the chip via a conductive bonding material,
    a second electrode connecting portion, and
    a current conductive portion which is connected to the first electrode connecting portion and the second electrode connecting portion and forms a current conductive path between the first electrode connecting portion and the second electrode connecting portion,
  wherein
    the lead further comprises cutouts or holes provided on the periphery of the first electrode connecting portion to which the current conducting portion is not connected, in a planar view, at positions oppositely to the first electrode connecting portion, and
    the cutouts or holes have a shape in which the opening width increases as one moves away from the first electrode connecting portion.

2. The semiconductor device according to claim 1, wherein the lead further comprises a bulging portion which bulges from the first electrode connecting portion on the side opposite to the current conductive portion, viewed in a plan view.

3. The semiconductor device according to claim 2, wherein the bulging portion bulges at a position symmetrically across the first electrode connecting portion.

4. The semiconductor device according to claim 1, wherein the cutouts or the holes are disposed at positions symmetrical with respect to the first electrode connecting portion.

5. The semiconductor device according to claim 1, further comprising
  a pin terminal which is disposed on the lead in a penetrating manner, wherein one end portion of the pin terminal protrudes to an outside.

6. The semiconductor device according to claim 1, wherein the lead further comprises
  another second electrode connecting portion on the opposite side from the first electrode connecting portion to the side connected to the current conducting portion, viewed in plan view, and
  another current conducting portion for serving as a current conducting path between the first electrode connecting portion and the another second electrode connecting portion.

7. The semiconductor device according to claim 6, wherein the another current conducting portion and the current conducting portion are located symmetrically across the first electrode connecting portion.

8. The semiconductor device according to claim 1, wherein the chip comprises a control electrode including a surface electrode different from the surface electrode, on the surface on which said surface electrode is provided, and the control electrode is inside the opening of the cutouts in a plan view.

9. The semiconductor device according to claim 1, wherein the cutouts or holes have vertices facing toward the another cutouts or holes and a pair of sides converging toward the vertex.

10. The semiconductor device according to claim 1, wherein the chip is on a substrate, and the surface electrode is on the side opposite to the substrate side.

11. A semiconductor device comprising:
  a first chip including a surface electrode on a surface of the first chip;
  a second chip including a surface electrode on a surface of the second chip;
  a first lead comprising:
    a first electrode connecting portion on the surface electrode and electrically connected to the surface electrode of the first chip via a conductive bonding material, a second electrode connecting portion of the first chip, and a current conductive portion which is connected to the first electrode connecting portion and the second electrode connecting portion and forms a current conductive path between the first electrode connecting portion and the second electrode connecting portion, and
  a second lead comprising:
    a first electrode connecting portion on the surface electrode and electrically connected to the surface electrode of the second chip via a conductive bonding material, a second electrode connecting portion of the second chip, and a current conductive portion which is connected to the first electrode connecting portion and the second electrode connecting portion and forms a current conductive path between the first electrode connecting portion and the second electrode connecting portion, wherein the first lead further comprises cutouts or holes on the periphery of the first electrode connecting portion, in a planar view, at a position opposite to the first electrode connecting portion, and the second lead further comprises cutouts or holes on the periphery of the first electrode connecting portion, in a planar view, at a position opposite to the second electrode connecting portion, and the semiconductor device further comprises:
a first pin terminal with one end protruding externally and the other end connected to a draw-out electrode from a drain electrode of the first chip; a second pin terminal disposed through the first lead, one end protruding externally and the other end connected to an electrode drawn from a drain electrode of the second chip; and a third pin terminal disposed through the second lead, one end of which protrudes externally.

12. The semiconductor device according to claim 11, further comprising: a fourth pin terminal as a signal terminal, located through the first lead and having one end protruding externally; a fifth pin terminal with one end protruding externally and the other end connected to a draw-out electrode from a control electrode of the first chip; and a sixth pin terminal as a signal terminal, located through the second lead having one end protruding externally; and a seventh pin terminal with one end protruding externally and the other end connected to a draw-out electrode from a control electrode of the second chip.

13. The semiconductor device according to claim 11, wherein the cutouts or holes in the first lead have a shape where the opening width widens as one moves away from the first electrode connecting portion, and the cutouts or holes in the second lead have a shape where the opening width widens as it moves away from the first electrode connecting portion.

14. The semiconductor device according to claim 11, wherein the cutouts or holes in the first lead are in symmetrical positions across the first electrode connecting portion, and the cutouts or holes in the second lead are at symmetrical positions across the first electrode connecting portion.

15. The semiconductor device according to claim 11, wherein the first lead further comprises a bulging portion in a plan view, extending from said first electrode connecting portion opposite to that connected to the current conducting portion; and the second lead is at a position where, viewed in a plan, the another current conducting portion and the current conducting portion face each other across the first electrode connecting portion.

16. The semiconductor device according to claim 11, wherein in the first lead, a control electrode is inside the opening of the cutouts, viewed in plan view, and in the second lead, a control electrode is inside the opening of the cutouts, viewed in plan view.

17. The semiconductor device according to claim 11, further comprising a plurality of second pin terminals as the second pin terminal.

18. The semiconductor device according to claim 17, further comprising two second pin terminals as the plurality of second pin terminals, wherein the two second pin terminals are on both sides across a virtual line connecting the cutouts or holes arranged in the first lead terminal.

19. The semiconductor device according to claim 11, wherein, the semiconductor device comprising a plurality of first pin terminals as the first pin terminal and a plurality of third pin terminals as the third pin terminal.

20. The semiconductor device according to claim 11, wherein the first chip and the second chip are on a substrate, and the surface electrode of the first chip and the surface electrode of the second chip are on opposite sides of the substrate side.

* * * * *